(12) United States Patent
Buenemann et al.

(10) Patent No.: US 12,044,751 B2
(45) Date of Patent: Jul. 23, 2024

(54) METHOD AND APPARATUS FOR IDENTIFYING AN ASSOCIATION OF PHASE LINES TO CONNECTIONS OF AN ELECTRICAL DEVICE CAPABLE OF UNBALANCED-LOAD OPERATION

(71) Applicant: SMA Solar Technology AG, Niestetal (DE)

(72) Inventors: Mathias Buenemann, Kassel (DE); Matthias Groene, Kassel (DE)

(73) Assignee: SMA Solar Technology AG, Niestetal (DE)

(*) Notice: Subject to any disclaimer, the term of this patent is extended or adjusted under 35 U.S.C. 154(b) by 576 days.

(21) Appl. No.: 17/215,076

(22) Filed: Mar. 29, 2021

(65) Prior Publication Data

US 2021/0215774 A1 Jul. 15, 2021

Related U.S. Application Data

(63) Continuation of application No. PCT/EP2019/069519, filed on Jul. 19, 2019.

(30) Foreign Application Priority Data

Sep. 28, 2018 (DE) ............... 10 2018 124 124.0

(51) Int. Cl.
*G01R 31/67* (2020.01)
*G01R 31/69* (2020.01)
(Continued)

(52) U.S. Cl.
CPC ........ *G01R 31/67* (2020.01); *H02J 13/00002* (2020.01); *G01R 19/2513* (2013.01);
(Continued)

(58) Field of Classification Search
CPC .... G01R 31/67; G01R 31/69; G01R 19/2513; H02J 13/00002; H02J 3/26;
(Continued)

(56) References Cited

U.S. PATENT DOCUMENTS

| | | | |
|---|---|---|---|
| 7,660,776 B1* | 2/2010 | Kious ............... | G06N 5/025 706/45 |
| 2005/0018371 A1* | 1/2005 | Mladenik ............ | H02H 3/00 361/78 |

(Continued)

FOREIGN PATENT DOCUMENTS

| | | | |
|---|---|---|---|
| CN | 106684894 A * | 5/2017 | ............ H02J 3/26 |
| DE | 10214738 A1 | 10/2003 | |

(Continued)

OTHER PUBLICATIONS

International Search Report dated Oct. 17, 2019 in connection with PCT/EP2019/069519.

*Primary Examiner* — Manish S Shah
*Assistant Examiner* — Christian T Bryant
(74) *Attorney, Agent, or Firm* — Eschweiler & Potashnik, LLC

(57) ABSTRACT

A method for identifying an assignment of phase lines of an electrical distribution grid to connections of an electrical device capable of unbalanced-load operation, wherein the device is connected to a plurality of phase lines of the electrical distribution grid, includes setting target parameters assigned to an unbalanced load profile at each of the connections of the electrical device, detecting a temporal profile of a measurement parameter on each of the plurality of phase lines using a detection circuit, comparing the detected temporal profiles of the measurement parameters with the target parameters of the unbalanced load profile for each of the plurality of phase lines, respectively, and iden- (Continued)

tifying the assignment of the phase lines to the connections on the basis of the comparison.

16 Claims, 3 Drawing Sheets

(51) Int. Cl.
  *H02J 3/00*     (2006.01)
  *H02J 3/26*     (2006.01)
  *H02J 13/00*    (2006.01)
  *G01R 19/25*    (2006.01)

(52) U.S. Cl.
  CPC .............. *G01R 31/69* (2020.01); *H02J 3/00* (2013.01); *H02J 3/26* (2013.01); *H02J 13/00004* (2020.01); *H02J 13/00006* (2020.01); *Y02E 40/50* (2013.01); *Y04S 10/50* (2013.01)

(58) Field of Classification Search
  CPC .. H02J 13/00004; H02J 13/00006; H02J 3/00; Y02E 40/50; Y04S 10/50
  See application file for complete search history.

(56) References Cited

U.S. PATENT DOCUMENTS

| | | | |
|---|---|---|---|
| 2008/0164862 A1* | 7/2008 | Tazzari | G01R 29/18 324/86 |
| 2008/0167826 A1* | 7/2008 | Murry | G01R 31/67 702/58 |
| 2010/0164473 A1 | 7/2010 | Caird | |
| 2011/0101777 A1* | 5/2011 | Jansma | H02J 1/14 307/38 |
| 2011/0130992 A1* | 6/2011 | Kolwalkar | G01R 29/18 702/66 |
| 2011/0161022 A1* | 6/2011 | Caird | G01R 29/18 702/62 |
| 2013/0134917 A1 | 5/2013 | Kaneko | |
| 2017/0256932 A1* | 9/2017 | Gigante | G01R 31/50 |
| 2018/0149682 A1 | 5/2018 | Klapper | |
| 2019/0170804 A1 | 6/2019 | Thomas | |
| 2019/0383869 A1* | 12/2019 | Achanta | H02J 13/00017 |
| 2020/0070678 A1 | 3/2020 | Krammer | |

FOREIGN PATENT DOCUMENTS

| | | |
|---|---|---|
| JP | 2004028773 A | 1/2004 |
| JP | 2013113695 A | 6/2013 |

* cited by examiner

METHOD AND APPARATUS FOR IDENTIFYING AN ASSOCIATION OF PHASE LINES TO CONNECTIONS OF AN ELECTRICAL DEVICE CAPABLE OF UNBALANCED-LOAD OPERATION

CROSS REFERENCE TO RELATED APPLICATIONS

This application is a continuation of International Patent Application number PCT/EP2019/069519, filed on Jul. 19, 2019, which claims priority to German Patent Application number 10 2018 124 124.0, filed on Sep. 28, 2018, and is hereby incorporated by reference in its entirety.

FIELD

The disclosure relates to a method for identifying an assignment of phase lines to connections of an electrical device capable of unbalanced-load operation. The method according to the disclosure is intended to ascertain which of a plurality of phase lines is connected to which connection of a plurality of connections of the electrical device. The disclosure likewise relates to an apparatus that is configured to perform the method according to the disclosure and to an electrical device capable of unbalanced-load operation having such an apparatus.

BACKGROUND

Electrical devices capable of unbalanced-load operation that are connected to a plurality of phase lines of an electrical distribution grid are known in principle. Such a device is, for example, a bidirectionally operable battery inverter that is connected at its input to a rechargeable battery and at its output to a plurality of phase lines carrying an AC voltage of a distribution grid for a building. The battery inverter may in this case be used to supply electric power to certain consumers in the building even in the event of failure of a public energy supply grid (ESG) to which the distribution grid of the building is connected. The battery inverter may, however, also be used for the purpose of energy management in the distribution grid of the building. In this case, a power flow from the public ESG into the distribution grid may be influenced in a targeted manner by a charging and/or discharging power of the battery, which is controlled by the battery inverter. Specifically, electrical energy drawn from the public ESG via the grid connection point within a billing period may be kept below a maximum value.

Such influencing of the power drawn via the grid connection point often has to be performed in a phase-selective manner, that is to say separately for each phase line. To this end, it is necessary for an assignment or a connection of the individual phase lines to the individual connections of the battery inverter not only to be known, but also to be established correctly. In the case of a manually established connection of the electrical device to the distribution grid, it may however be the case that individual phase lines are not connected to the connections actually intended for them, but are connected, for example, in an interchanged manner. This may lead to incorrect operation of the electrical device (here: the battery inverter) in the distribution grid and/or partial overloading of the distribution grid, and possibly to damage to the device itself or to damage to other consumers connected to the distribution grid.

US 2010/0164473 A1 discloses a method for identifying phases on a consumer-side energy meter in a multiphase electrical energy distribution grid comprising a transformer substation. In the method, a signal generator supplies a different signal on each of a plurality of phases leaving the substation. A signal discriminator detects each of the various signals at a consumer consuming the electrical energy.

Document US 2010/0164473 A1 discloses a multiphase power distribution grid having a substation, a signal generator for supplying a different signal on each of a plurality of phases leaving the substation, and a signal discriminator. The signal discriminator is used to detect each of the various signals at a consumer consuming the electric power.

Document AT 517620 A1 discloses an apparatus in an energy system. The apparatus has inputs that are able to be conductively connected to at least one current converter and at least one voltage converter. A test apparatus for testing the wiring of the at least one current converter and the at least one voltage converter is designed to apply a first test signal to a secondary side of the voltage converter and at the same time to impress a second test signal into a primary side of the current converter.

SUMMARY

The disclosure is directed to a method to identify an assignment, in particular a correct or incorrect assignment, or a connection, in particular a correct or incorrect connection, of phase lines to connections of an electrical device capable of unbalanced-load operation. The method, in one embodiment, is implemented in a manner as simple and inexpensive as possible. When applying the method, in one embodiment, maximum use is made of components of the electrical device capable of unbalanced-load operation that are already present. The disclosure additionally comprises an apparatus that is designed to perform the method according to the disclosure, and an electrical device having such an apparatus.

A method according to the disclosure for identifying an assignment of phase lines of an electrical distribution grid to connections of an electrical device capable of unbalanced-load operation, wherein the device is connected to a plurality of phase lines of the electrical distribution grid, comprises:
 setting target parameters assigned to an unbalanced load profile at the connections of the electrical device,
 detecting a measurement parameter, in particular a temporal profile of a measurement parameter, on each of the plurality of phase lines to which the electrical device is connected, by way of a detection unit,
 comparing the detected measurement parameters with the target parameters of the unbalanced load profile, and
 identifying the assignment of the phase lines to the connections on the basis of the comparison.

According to the disclosure, identifying an assignment of phase lines of an electrical distribution grid to connections of an electrical device capable of unbalanced-load operation should also be understood to mean identifying a connection of phase lines of an electrical distribution grid to connections of an electrical device capable of unbalanced-load operation. The method may, for example, be used to identify a correct assignment or an incorrect assignment of the phase lines to the connections of the electrical device. A distribution grid should be understood, for example, to mean an AC voltage distribution grid. An "electrical device capable of unbalanced-load operation" should be understood to mean, in one embodiment, an electrical device that is configured, when it is operating, to generate different power flows via the at least two different connections—and thus in the phase lines connected thereto. In this case, the term "capable of unbalanced-load operation" means in particular that the power flows are different in the connected phase lines not only at one point in time, but also on average over time, for example, averaged over a plurality of grid periods. The term "unbalanced load profile" should also accordingly be understood, in one embodiment, within the application in the sense of a multiphase power profile averaged in time over a plurality of grid periods, in the sense in each case of an enveloping curve or a power amplitude of an otherwise sinusoidal electric power within the individual phase lines. As an alternative, the unbalanced load profile may, for example, comprise the temporal profile of a difference between the powers in the individual phase lines.

In order to identify the assignment of the phase lines to the connections of the device, the method makes use of the fact that the device capable of unbalanced-load operation is capable of setting powers according to different target parameters at its connections. By setting different target parameters at the respective connections of the electrical device, different power flows are generated via the respective connections of the device, and thus different power flows are also generated in the phase lines connected to the respective connections. It goes without saying that this is only the case for each of the respective connections if the corresponding connection is also connected to a phase line. If, on the other hand, a connection is not connected to a phase line, that is to say if it is an open connection, no power flow is able to be generated thereon or therethrough. The measurement parameters detected in or on the phase lines via the detection unit likewise differ due to the different power flows in the phase lines. In particular, characteristic signal forms that are set at the connections of the device capable of unbalanced-load operation via the target parameters are also present at least in a mutually distinguishable shape and in a manner temporally correlated with the target parameters in the measurement parameters that are detected on the phase lines. The shape of the signal forms in the measurement parameters may prove to be less pronounced than the signal forms that are present at the connections of the electrical device and are predefined by the target parameters. This is due, inter alia, to the fact that the signal forms are overlaid with power flows of other consumers that are connected to some of the phase lines. This leads to the signal forms being influenced, in particular attenuated. Nevertheless, it has been shown that the shape of the signal forms in the phase lines, even if these are overlaid with the power flows of the other consumers, is still present to a degree sufficient to distinguish the phase lines from one another. The shape of the signal forms is also sufficient to assign the measurement parameters to the respective target parameters, taking into account a temporal correlation, and thus to be able to trace the phase lines to the connections of the device. By comparing the measurement parameters with the target parameters, it is thus possible firstly to identify whether the plurality of phase lines are correctly connected to the plurality of connections of the electrical device. If the assignment or the connection of the phase lines to the connections is established incorrectly, the method may also be used to ascertain which changes are required for a correct connection of the phase lines to the connections of the device, in other words which phase line needs to be correctly connected to which connection. One advantage in this case is that the electrical device capable of unbalanced-load operation is itself already capable of generating different power flows via the respective connections of the device, and therefore also different power flows in the phase lines connected to the respective connections. No separate signal generator is therefore required in order to generate the unbalanced load profile, since the electrical device capable of unbalanced-load operation itself has the corresponding functionality.

As will be explained in more detail in connection with the apparatus according to the disclosure, many components required for performing the method according to the disclosure, for example a control unit and an evaluation unit, are usually already present in the electrical device. Their capacity is often sufficient, meaning that the necessary functionalities are able to be performed by the components that are already present in the electrical device. In this case, the apparatus, at least the majority thereof, is an integral part of the device itself. The method may therefore be implemented simply through a corresponding program adaptation within the control software, and thus inexpensively and without a great deal of effort. However, even if the apparatus for performing the method according to the disclosure is designed as a separate unit, which may, for example, also be part of the detection unit, it may be used for a multiplicity of different devices capable of unbalanced-load operation. Specifically, it is sufficient, in one embodiment, to perform the method according to the disclosure only once on the device capable of unbalanced-load operation, for example after it has been installed—as a final test, as it were. In this case, the costs for the apparatus are incurred only once, but may be used for a multiplicity of devices capable of unbalanced-load operation. In summary, the method may therefore also be performed with relatively little effort and relatively inexpensively in this case.

In one advantageous embodiment of the method, a start, possibly also an end, of the setting of the target parameters of the unbalanced load profile is signaled by the electrical device. By virtue of the signaling, characteristic points in time when setting the unbalanced load profile at the connections of the electrical device capable of unbalanced-load operation are temporally synchronized with the start of detection—possibly also the end of detection—of the measurement parameters on the phase lines. This is advantageous in order to check a temporal correlation between the respective signal forms when comparing the measurement parameters with the target parameters.

It is possible in principle for the measurement parameters, possibly also the target parameters, to be in the form of non-electrical parameters. Specifically, for example, the measurement parameters, as well as the target parameters, may be thermal parameters. In one advantageous embodiment of the method, however, the target parameters and/or the measurement parameters are of an electrical nature, that is to say are in each case in the form of electrical parameters. In this case, the electrical target parameters by way of which the unbalanced load profile is set at the connections of the electrical device and/or the electrical measurement parameters that are detected in or on the phase lines may comprise a current $I(t)$, a voltage $U(t)$, a power $P(t)$ and/or a phase difference $\phi$ between current $I(t)$ and voltage $U(t)$. The unbalanced load profile should be understood to mean not only different active powers that are set at the connections. On the contrary, it is also possible to use the target parameters to set different reactive powers and/or different ratios of active and reactive power at the connections of the device. Likewise, different reactive powers or different ratios of active and reactive power may also be detected on the phase lines using the measurement parameters.

The method advantageously comprises signaling a correct assignment or an incorrect assignment of the phase lines to the respective connections on the basis of the comparison. An installer of the electrical device may thereby, for example, receive feedback immediately after installation as to whether the phase lines have been correctly connected to the connections of the device. In the event of incorrect assignment of the connections of the electrical device to the phase lines, the phase lines may be disconnected from the connections and reconnected in the correct manner. In the case of the electrical devices capable of unbalanced-load operation in question, it is often customary or intended to connect each of the plurality of connections to only one specific phase line provided for the respective connection. Correct assignment of the phase lines to the connections accordingly means that each of the connections is also connected to that phase line that is provided for this connection. Conversely, this means that, if at least one connection is connected to a phase line that is not provided for it, the phase line is incorrectly assigned to the respective connections. A correct or an incorrect assignment may be signaled visually or acoustically. As an alternative, the signaling may also be transmitted by radio to a communication device, for example a smartphone, of an operator or an installer of the electrical device. However, an incorrect assignment does not necessarily have to be corrected by changing the connection of the phase lines to the connections of the device in terms of hardware. As an alternative thereto, it is also possible within the scope of the disclosure to respond to an incorrect assignment of the phase lines to the connections by way of a software change on the device itself or a controller connected to the device. Specifically, separate connection names for the individual connections of the electrical device may be provided in a piece of software. Each connection name is in this case uniquely assigned to a corresponding connection. If an incorrect or unintended assignment should then result when the method is performed, then the assignment of the connection names to the connections within the software may be adapted such that the originally intended phase lines are addressed if the connection names are retained. The software change may be performed automatically when the method is performed, as an additional method step as it were, and be triggered by the signaling of an incorrect assignment.

In one embodiment of the method, the target parameters of the unbalanced load profile are predefined by the device itself or by a controller connected to the device. These are usually target parameters that have particularly pronounced signal forms and are usually created and stored explicitly to identify the assignment of the phase lines to the connections, that is to say exclusively for test purposes. The stored target parameters are then retrieved and predefined when the method is intended to be performed on the device. The controller connected to the device may be a controller designed for energy management of a building. As an alternative thereto, the controller connected to the device may also comprise a separately formed apparatus for performing the method, in particular its control unit.

In one alternative embodiment of the method, the target parameters assigned to the unbalanced load profile are set at the connections during normal operation of the device. This is the case for example if a pronounced unbalanced load profile is already present or foreseeable at certain times during normal operation of the device. It is within the scope of the disclosure for electrical variables to be measured at the connections of the electrical device and used to determine the target parameters. This is advantageous for example as an additional check on the target parameters to be set at the connections. The electrical variables or the target parameters may be communicated by the device, for example to an apparatus, formed separately and connected to the device, for performing the method.

In one embodiment of the method, the target parameters of the unbalanced load profile have current amplitudes that are temporally constant within a period $\Delta t$ of at least 30 s but that differ between the connections. This is possible when power flows of additional energy-consuming or energy-generating devices that are connected to the phase lines of the distribution grid are small in comparison with those power flows that are caused by the electrical device and flow via each of the connections. In such a case, a current amplitude that is temporally constant but that differs for the individual connections is sufficient to generate an unbalanced load profile at the same voltage at the connections, such that the measurement parameters are guaranteed to be traceable back to the target parameters, and identification of the assignment of the phase lines to the connections is thus guaranteed.

An apparatus according to the disclosure for identifying an assignment of phase lines of an electrical distribution grid to connections of an electrical device capable of unbalanced-load operation is connected to a detection unit for detecting a measurement parameter on each of the plurality of phase lines of the electrical distribution grid to which the device is connected. The apparatus comprises an evaluation unit for comparing the measurement parameters detected on the phase lines with target parameters, wherein the target parameters are set at the connections of the device and are assigned to an unbalanced load profile. By setting the target parameters, the unbalanced load profile is generated at the respective connections of the electrical device and in the phase lines connected to the respective connections. Of course, this is only the case for each of the respective connections if the corresponding connection is also connected to a phase line. If a connection is not connected to a phase line, no power flow is able to be generated thereon or therethrough either. The apparatus comprises a control unit that is configured and designed to perform the method according to the disclosure. The measurement parameters, possibly also the target parameters, may each be of an electrical nature, that is to say they may each be in the form of electrical parameters. This results in the advantages already mentioned in connection with the method.

An electrical device capable of unbalanced-load operation according to the disclosure contains a plurality of connections via which the device is able to be connected, in particular is connected, to a multiplicity of phase lines of an electrical distribution grid. The electrical device is characterized in that it comprises an apparatus according to the disclosure for identifying an assignment of the phase lines of the electrical distribution grid to the connections, or in that it is connected to such an apparatus according to the disclosure. This also results here in the advantages already mentioned in connection with the method. Since the electrical device contains the apparatus or is connected thereto, the evaluation unit or the control unit of the apparatus, possibly also both, may be formed by at least one corresponding unit that is already present in the device. Such a unit may for example be a microprocessor that is not yet operated at full load with the control and evaluation functions to be performed for the device in any case, and thus still has free capacities with regard to such functions.

According to one embodiment of the electrical device, the device is selected from a group that comprises the following device classes:

an energy-feeding device, in particular a photovoltaic (PV) inverter,
an energy-consuming electrical device, and
a device that is both energy-feeding and energy-consuming, for example a battery inverter.

BRIEF DESCRIPTION OF THE FIGURES

The following text further explains and describes the disclosure with reference to various embodiments illustrated in the figures.

DETAILED DESCRIPTION

Figure 1:
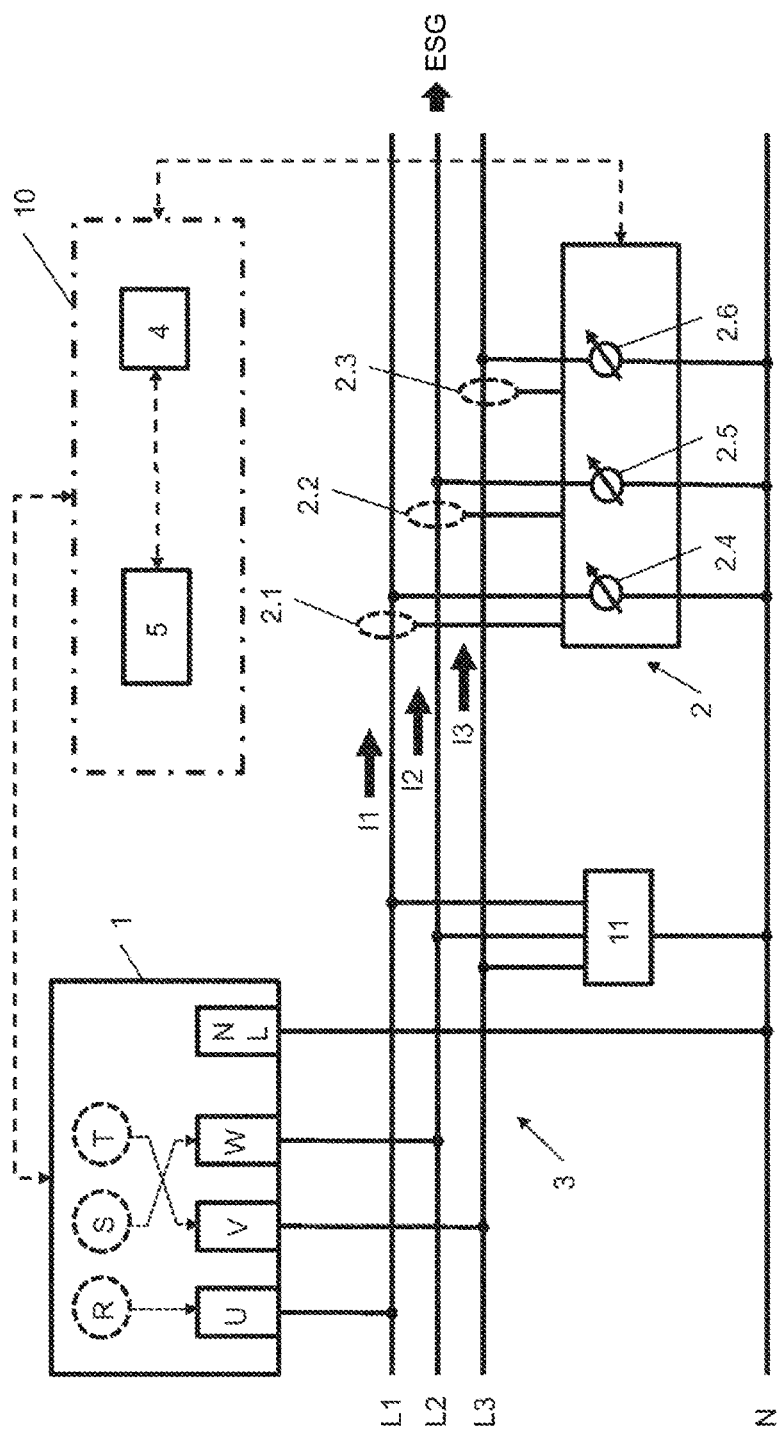
FIG. 1 shows an apparatus according to the disclosure for identifying an assignment of phase lines of a distribution grid to connections of an electrical device in a first embodiment.

FIG. 1 illustrates an apparatus 10 according to the disclosure for identifying an assignment of phase lines L1, L2, L3 of a distribution grid 3 to connections U, V, W, NL of an electrical device 1 in a first embodiment. The electrical device 1 is by way of example a device 1 that is both energy-feeding and energy-consuming, in particular a bidirectionally operable battery inverter. The device 1 has a plurality of phase connections U, V, W that are connected to phase lines L1, L2, L3 of the electrical distribution grid 3. The device additionally comprises a connection NL, which is connected to a neutral conductor N of the electrical distribution grid 3. The distribution grid 3 is designed, for example, as a domestic distribution grid of a building, which is connected on one side to the public energy supply grid ESG. The device 1 is designed both to feed electric power in the form of an unbalanced load profile into the distribution grid 3 and to draw or to consume electrical energy from the distribution grid 3. Using the electrical energy fed into the distribution grid 3 or drawn from the distribution grid 3, the electrical device 1 is in particular able to discharge or recharge a battery connected thereto (not shown in FIG. 1). An electrical consumer 11 is additionally connected to the distribution grid 3. The consumer 11 is illustrated by way of example as a three-phase consumer that is connected to each of the phase lines L1, L2, L3 and to the neutral conductor N. However, it is also possible for the consumer 11 to be a single-phase or two-phase consumer. In addition to the one consumer 11 that is illustrated, further single-phase or multiphase consumers may furthermore additionally be connected to the distribution grid 3. As an alternative or in addition to the consumer 11, an energy-feeding device may also be connected to the distribution grid 3.

In the case of the electrical device 1, it is intended to uniquely connect each of the connections U, V, W to a specific phase line L1, L2, L3. Specifically, it is intended for a first connection U to be connected to a first phase line L1, for a second connection V to be connected to a second phase line L2 and for a third connection W to be connected to a third phase line L3. As illustrated in FIG. 1, the electrical device 1 with its connections U, V, W is however incorrectly connected to the phase lines L1, L2, L3 of the distribution grid 3. By way of example, although a first connection U is still connected to the first phase line L1 correctly assigned thereto, a second connection V is incorrectly connected to the third phase line L3 and a third connection W is incorrectly connected to the second phase line L2. The connection NL is correctly connected to the neutral conductor N of the distribution grid 3.

In order to identify an assignment of the phase lines L1, L2, L3 to the connections U, V, W of the device 1, an apparatus 10 for control and data exchange is connected to the device 1. The control and data connection is symbolized in FIG. 1 by a dashed line. The apparatus 10 comprises a control circuit or unit 5 and an evaluation circuit or unit 4 connected thereto. The apparatus 10 is connected to a detection circuit or unit 2, which is configured, in one embodiment, to detect a respective electrical parameter 21a, 21b, 21c, for example, a respective temporal profile of the electrical parameters 21a, 21b, 21c (see, e.g., FIG. 2) on each of the plurality of phase lines L1, L2, L3 to which the electrical device 1 is also connected. By way of example, the detection circuit or unit 2 comprises current sensors 2.1, 2.2, 2.3 for detecting currents I1, I2, I3 through the phase lines L1, L2, L3 and voltage sensors 2.4, 2.5, 2.6 in order to determine a voltage of the phase lines L1, L2, L3.

In order to identify an assignment of the phase lines L1, L2, L3 or to determine which of the phase lines L1, L2, L3 is connected to which of the connections U, V, W of the device 1, the apparatus 10, in particular its control circuit unit 5, transmits target parameters 20a, 20b, 20c, assigned to an unbalanced load profile, to the device 1 as target values. In response thereto, the device 1 sets the target parameters 20a, 20b, 20c assigned to the predefined unbalanced load profile at its connections U, V, W. In other words, the device 1 thus generates an electric power flow via the connections U, V, W, which corresponds to the target parameters 20a, 20b, 20c of the predetermined unbalanced load profile. In this case, the device 1 signals a start for running through the target parameters 20a, 20b, 20c to the apparatus 10. Triggered by this signaling, the apparatus 10 drives the detection circuit or unit 2 to perform measurements of current I1, I2, I3 and voltage U1, U2, U3 on each of the phase lines L1, L2, L3. The values measured by the detection circuit or unit 2 are transmitted to the apparatus 10, in particular its evaluation circuit or unit 4, in the form of measurement parameters 21a, 21b, 21c. As explained in more detail in FIG. 2, the evaluation circuit or unit 4 determines a currently existing assignment of the phase lines L1, L2, L3 or their electrical connection to the connections U, V, W of the device 1 by comparing the measurement parameters 21a, 21b, 21c with the target parameters 20a, 20b, 20c of the predefined unbalanced load profile.

Figure 2:
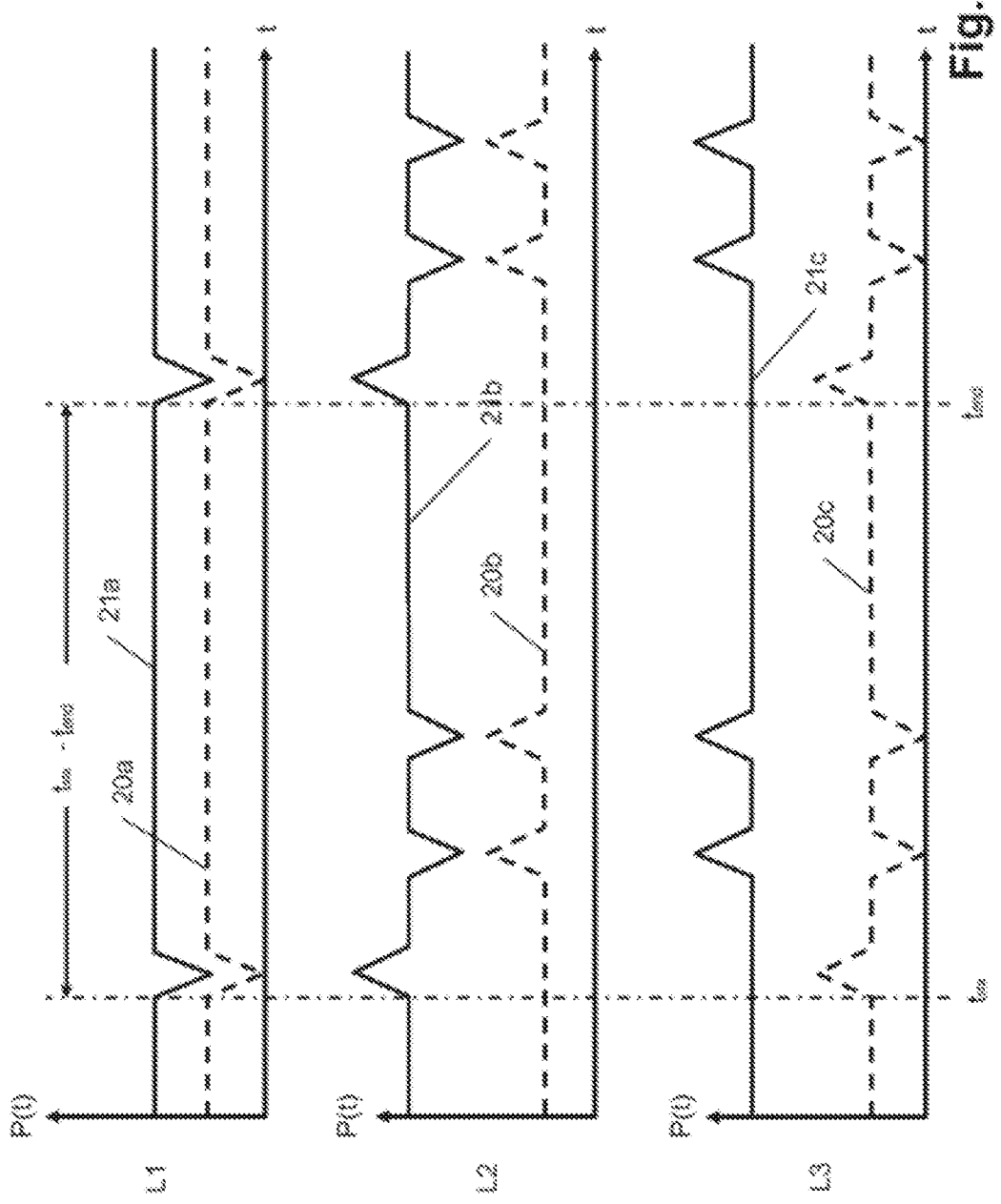
FIG. 2 shows an illustration of measured parameters in comparison with an unbalanced load profile, which is considered to be known, as a function of time.

FIG. 2 shows graphs of the measurement parameters 21a, 21b, 21c measured on the phase lines L1, L2, L3 in comparison with the target parameters 20a, 20b, 20c, considered to be known because they are predefined, of the unbalanced load profile as a function of time t. By way of example, the comparison is performed on the basis of an electric power P(t) as a target parameter and also as a measurement parameter. The powers P(t) ascertained by the evaluation unit 4 from the measurements of current I1, I2, I3 and voltage U1, U2, U3 for each of the phase lines L1, L2, L3 are illustrated as measurement parameters 21a, 21b, 21c in the individual graphs in each case in the form of solid lines. The powers P(t) predefined for the respective connections U, V, W, that is to say the target parameters 20a, 20b, 20c of the unbalanced load profile, are in each case illustrated in the form of a dashed line. In FIG. 2, the target parameters 20a, 20b, 20c are in this case shown in the graphs of those phase lines L1, L2, L3 in which they would occur if the phase lines L1, L2, L3 were to be assigned correctly to the connections U, V, W. The target parameters 20a, 20b, 20c and measurement parameters 21a, 21b, 21c illustrated in the graphs should each be understood in the sense of an enveloping function or as time-dependent power amplitudes of the otherwise sinusoidal instantaneous electric powers.

The target parameters 20a, 20b, 20c of the unbalanced load profile illustrated by way of example in FIG. 2 have different sawtooth-like power increases or power drops as signal forms for each connection U, V, W. Specifically, the power flow generated by the device 1 via the connection U—that is to say the target parameter 20a—is characterized by a sawtooth-like power drop repeating in a time interval $t_{sta}$-$t_{end}$. The power flow generated by the device 1 via the connection V—that is to say the target parameter 20b—has two consecutive sawtooth-like power increases. The power flow generated by the device 1 via the connection W—that is to say the target parameter 20c—contains a sawtooth-like power increase followed by two sawtooth-like power drops. The power flows generated by the device 1 via the connections V and W as target parameters 20b, 20c also repeat after the time interval $t_{sta}$-$t_{end}$.

The measurement parameters 21a, 21b, 21c determined on the phase lines L1, L2, L3 by way of the detection circuit or unit 2—here the measured electric powers P(t)—are compared, by the evaluation circuit or unit 4, with the temporal profiles of the target parameters 20a, 20b, 20c set at the connections U, V, W. By way of example, a comparison of the measurement parameter 21a determined on the first phase line L1 with the target parameter 20a set on the first connection U reveals a temporal match between the sawtooth-like power drops. It may therefore be assumed that the first phase line L1 is connected correctly to the first connection U. On the other hand, a comparison of the measurement parameter 21b determined on the second phase line L2 with the target parameter set on the second connection V does not provide a match between the sawtooth-like power drops or power increases. The same applies to a comparison of the measurement parameter 21c determined on the third phase line L3 with the target parameter 20c set on the third connection W. It may therefore be concluded that the second phase line L2 is not—as correctly intended—connected to the second connection V. It may likewise be concluded that the third phase line L3 is not—as intended—connected to the third connection W assigned thereto. However, the power drops or power increases of the measurement parameter 21b measured on the second phase line L2 match the power drops and power increases of the target parameter 20c set on the third connection W. A corresponding match is also revealed when comparing the measurement parameter 21c determined on the third phase line L3 with the target parameter 20b set on the second connection V. It may be concluded therefrom that the second phase line L2 is incorrectly connected to the third connection W and the third phase line L3 is incorrectly connected to the second connection V. The incorrect assignment of the phase lines L2, L3 to the connections V, W may be signaled by the apparatus 10.

The incorrect assignment may be corrected on the one hand by the electrical connection of the phase lines L2, L3 to the connections W, V being disconnected and reconnected with the correct assignment, for example by a qualified electrical engineer. As an alternative, the incorrect assignment may however also be corrected by a software change on the device 1 itself or on a controller upstream of the device 1. The latter is illustrated schematically in FIG. 1. Certain connection names R, S, T are thus assigned to the connections U, V, W of the device 1 within the software. Specifically, if the phase lines L1, L2, L3 are correctly connected to the connections U, V, W, the connection name R (via the first connection U) is assigned to the first phase line L1, the connection name S (via the second connection V) is assigned to the second phase line L2 and the connection name T (via the third connection W) is assigned to the third phase line L3. In order to correct the resultant incorrect assignment of the connection names S, T to the phase lines L2, L3 via the connections W, V in FIG. 1, within the software of the device 1, the connection name S is assigned to the third connection W and thus to the second phase line L2, and the connection name T is assigned to the second connection V and thus to the third phase line L3. As originally planned and despite the continued incorrect connection of the phase lines L2, L3 to the connections W, V, the connection name S is thereby also linked to the second phase line L2, and the connection name T is linked to the third phase line L3.

The signal forms illustrated in FIG. 2 in the temporal profiles of the target parameters 20a, 20b, 20c (here: the sawtooth-like power increases and power drops) are purely exemplary in nature, and other signal forms are alternatively possible. The signal forms of the target parameters 20a, 20b, 20c should however differ from one another firstly in particular in terms of their shape and/or the point in time at which a signal form occurs, in order to guarantee traceability to the connections U, V, W assigned thereto. Secondly, they should be selected such that they occur within the measurement parameters 21a, 21b, 21c and in particular in a manner overlaid with further variations that are generated by other devices connected to the phase lines L1, L2, L3 of the distribution grid 3, for example, further consumers 11, and are thus able to be identified. This is especially important if the further variations generated by the other devices are not temporally constant signal forms as illustrated in FIG. 2 (that is to say just an offset within the superimposition), but rather are likewise temporally variable variations. In order for the signal forms of the target parameters 20a, 20b, 20c to be able to be identified in the measurement parameters 21a, 21b, 21c, it is possible to adaptively adjust the target parameters on the basis of the further variations detected in any case in the phase lines L1, L2, L3. In other words, the greater the extent to which the further variations occur in the measurement parameters 21a, 21b, 21c, the more pronounced the signal forms of the target parameters 20a, 20b, 20c may also be selected to be. By way of example, it is possible for a certain signal form of the target parameters 20a, 20b, 20c to be repeated at a frequency that is characteristic of the respective connection U, V, W and different from a grid frequency of the distribution grid 3. This signal form may thus also be detected in the measurement parameters 21a, 21b, 21c of the phase lines L1, L2, L3 connected to the connections U, V, W. The measurement parameters 21a, 21b, 21c may be analyzed for the existence of the frequencies characteristic for the connections U, V, W by way of a Fourier transform. The frequencies ascertained in the measurement parameters 21a, 21b, 21c may then be used to infer the target parameters 20a, 20b, 20c corresponding to these frequencies, and thereby the respective connections U, V, W.

Figure 3:
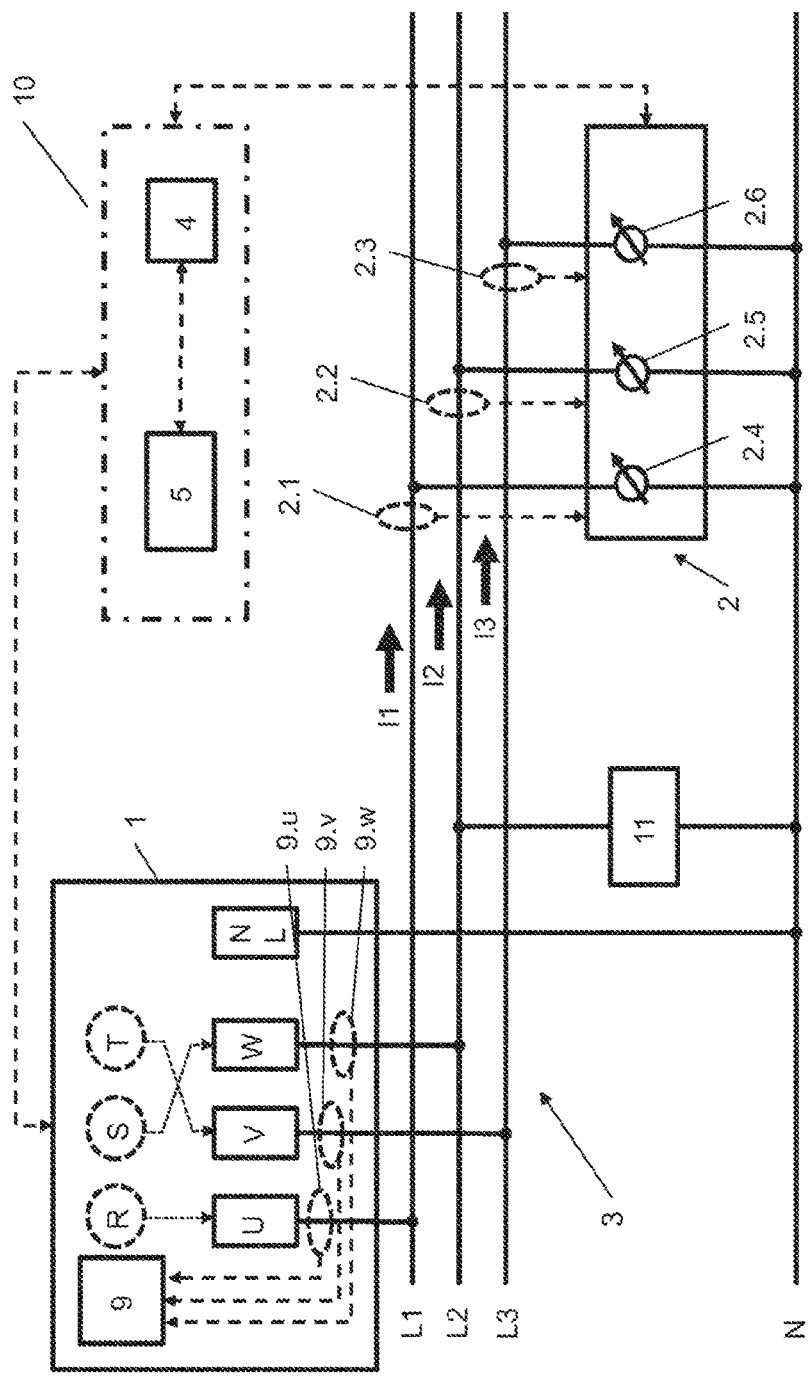
FIG. 3 shows an apparatus according to the disclosure for identifying an assignment of phase lines of a distribution grid to connections of an electrical device in a second embodiment.

FIG. 3 illustrates an apparatus 10 according to the disclosure for identifying an assignment of phase lines L1, L2, L3 of a distribution grid 3 to connections U, V, W of an electrical device 1 in a second embodiment. FIG. 3 corresponds in many of its features to FIG. 1, for which reason reference is made to the description of FIG. 1 with regard to the similar features. Therefore, only the differences between the second embodiment and the embodiment according to FIG. 1 are explained below.

In contrast to FIG. 1, the electrical device 1 of FIG. 3 has a detection apparatus 9 having current sensors 9*u*, 9*v*, 9*w* and voltage sensors (not illustrated in FIG. 3 for the sake of clarity). The detection apparatus 9 is configured to detect currents IU, IV, IW flowing through the outputs U, V, W and voltages UU, UV, UW present at the outputs U, V, W as electrical variables, and communicate the detected electrical variables to the apparatus 10. In contrast to FIG. 1, the device 1 does not receive any information with regard to an unbalanced load profile to be set at its connections U, V, W. By contrast, the device 1 in FIG. 3 itself decides when the method for identifying an assignment of phase lines L1, L2, L3 to the connections U, V, W is started. The method may in this case be performed during normal operation of the device 1, for example when an unbalanced load profile suitable for the method is present or expected at the connections U, V, W of the device 1. If this is the case, then the device 1 signals a start time $t_{sta}$ for the method to the apparatus 10. The device 1 then, at its connections U, V, W, measures the currents IU, IV, IW flowing through the connections U, V, W and the voltages UU, UV, UW prevailing there in the form of electrical variables. As also described in FIG. 1, the device 1 signals a starting time $t_{sta}$ of the method at which the detection of the electrical variables begins. Triggered by the signaling of the starting time $t_{sta}$ by the device 1, the apparatus 10 then drives the detection circuit or unit 2 connected thereto in order to detect measurement parameters 21*a*, 21*b*, 21*c* on the phase lines L1, L2, L3. The detection of the electrical variables at the connections U, V, W of the device 1 and of the measurement parameters 21*a*, 21*b*, 21*c* on the phase lines L1, L2, L3 is performed for a predetermined period or until this is ended by the device 1 or the apparatus 10. The device 1 advantageously likewise signals to the apparatus 10 an end time $t_{end}$ that ends the detection of the electrical variables at the connections U, V, W or of the measurement parameters 21*a*, 21*b*, 21*c* on the phase lines L1, L2, L3. The device 1 communicates the electrical variables or their temporal profiles to the apparatus 10. The evaluation circuit or unit 4 of the apparatus interprets the communicated electrical variables—possibly after further processing them—as target parameters 20*a*, 20*b*, 20*c* of the set unbalanced load profile. Comparison of the target parameters 20*a*, 20*b*, 20*c* of the unbalanced load profile with the measurement parameters 21*a*, 21*b*, 21*c* ascertained on the phase lines L1, L2, L3, and also—if necessary—correction of an incorrect assignment of phase lines L1, L2 L3 and connections U, V, W then takes place in a manner analogous to that described in FIG. 2.

The invention claimed is:

1. A method for identifying an assignment of phase lines of an electrical distribution grid to connections of an electrical device capable of unbalanced-load operation, wherein the electrical device is connected to a plurality of phase lines of the electrical distribution grid, comprising:
   setting target parameters assigned to an unbalanced load profile concurrently at each of the connections of the electrical device as signal forms having temporal profiles that differ from one another,
   detecting a temporal profile of a measurement parameter on each of the plurality of phase lines using a detection circuit,
   comparing the detected temporal profiles of the measurement parameters with the target parameters of the unbalanced load profile for each of the plurality of phase lines, respectively, and
   identifying the assignment of the phase lines to the connections on the basis of the comparison.

2. The method as claimed in claim 1, further comprising signalling a start or an end, or both, of the setting of the target parameters of the unbalanced load profile by the electrical device.

3. The method as claimed in claim 1, wherein the target parameters and/or the measurement parameters are each of an electrical nature and comprise one or more of a current I(t), a voltage U(t), a power P(t), and a phase difference $\phi$ between current I(t) and voltage U(t).

4. The method as claimed in claim 1, further comprising signalling a correct assignment or an incorrect assignment of the phase lines to the respective connections on the basis of the comparison.

5. The method as claimed in claim 1, wherein the target parameters of the unbalanced load profile are set during normal operation of the device.

6. The method as claimed in claim 1, wherein the target parameters of the unbalanced load profile are predefined by the device itself or by a controller connected to the device.

7. The method as claimed in claim 1, further comprising conducting a corrective action to an incorrect assignment of the phase lines using a software change of the device itself or of a controller connected to the device.

8. The method as claimed in claim 1, wherein the target parameters of the unbalanced load profile have current amplitudes that are temporally constant within a period $\Delta t$ of at least 30 s but that differ between the connections.

9. The method as claimed in claim 1, further comprising measuring electrical variables at the connections of the electrical device and using the measured electrical variables in setting the target parameters.

10. The method as claimed in claim 1, wherein signal forms that are set at the connections of the electrical device capable of unbalanced-load operation via the set target parameters are also present at least in a mutually distinguishable shape and in a manner temporally correlated with the target parameters in the measurement parameters that are detected on the phase lines.

11. An apparatus for identifying an assignment of phase lines of an electrical distribution grid to connections of an electrical device configured to provide unbalanced-load operation, comprising:
   a control circuit configured to set target parameters assigned to an unbalanced load profile concurrently at each of the connections of the electrical device as signal forms having temporal profiles that differ from one another,
   a detection circuit configured to detect a temporal profile of a measurement parameter on each of the plurality of phase lines of the electrical distribution grid to which the electrical device is connected, respectively,
   an evaluation circuit configured to compare the detected temporal profiles of the measurement parameters with the set target parameters,
   wherein the control circuit is further configured to identify the assignment of the phase lines to the connections of the electrical device based on the comparison performed by the evaluation circuit.

12. The apparatus as claimed in claim 11, wherein signal forms that are set at the connections of the device capable of unbalanced-load operation via the set target parameters are also present at least in a mutually distinguishable shape and in a manner temporally correlated with the target parameters in the measurement parameters that are detected on the phase lines.

13. An electrical device configured to provide unbalanced-load operation having a plurality of connections via which the device is able to be connected to a multiplicity of phase lines of an electrical distribution grid, wherein the electrical device comprises an apparatus for identifying an assignment of the phase lines of the electrical distribution grid to the connections, the apparatus comprising:
- a control circuit configured to set target parameters assigned to an unbalanced load profile concurrently at each of the connections of the electrical device as signal forms having temporal profiles that differ from one another,
- a detection circuit configured to detect a temporal profile of a measurement parameter on each of the plurality of phase lines of the electrical distribution grid to which the electrical device is connected, respectively,
- an evaluation circuit configured to compare the detected temporal profiles of the measurement parameters with the set target parameters,
- wherein the control circuit is further configured to identify the assignment of the phase lines to the connections of the electrical device based on the comparison performed by the evaluation circuit.

14. The electrical device as claimed in claim 13, wherein the electrical device is selected from a group that contains the following device classes:
- an energy-feeding device,
- an energy-consuming electrical device, and
- a device that is both energy-feeding and energy-consuming.

15. The electrical device as claimed in claim 14, wherein the energy-feeding device comprises a photovoltaic (PV) inverter, and the device that is both energy-feeding and energy-consuming comprises a battery inverter.

16. The electrical device as claimed in claim 13, wherein characteristic signal forms that are set at the connections of the device capable of unbalanced-load operation via the set target parameters are also present at least in a mutually distinguishable shape and in a manner temporally correlated with the target parameters in the measurement parameters that are detected on the phase lines.

* * * * *